United States Patent [19]
Storer

[11] Patent Number: 5,379,036
[45] Date of Patent: Jan. 3, 1995

[54] METHOD AND APPARATUS FOR DATA COMPRESSION

[76] Inventor: James A. Storer, 89 S. Great Rd., Lincoln, Mass. 01773

[21] Appl. No.: 861,572

[22] Filed: Apr. 1, 1992

[51] Int. Cl.[6] ............................................. H03M 7/30
[52] U.S. Cl. ...................................................... 341/51
[58] Field of Search ......................................... 341/51

[56] References Cited

U.S. PATENT DOCUMENTS

| | | | |
|---|---|---|---|
| 4,558,302 | 12/1985 | Welch | 341/51 |
| 4,814,746 | 3/1989 | Miller et al. | 341/95 |
| 4,847,619 | 7/1989 | Kato et al. | 341/51 |
| 4,876,541 | 10/1989 | Storer | 341/51 |
| 4,881,075 | 11/1989 | Weng | 341/87 |
| 5,175,543 | 12/1992 | Lantz | 341/51 |

OTHER PUBLICATIONS

Gonzalez-Smith, et al., "Parallel Algorithms for Data Compression"; Journal of the Association for Computing Machinery; vol. 32 No. 2, Apr. 1985 pp. 344-373.

*Primary Examiner*—Howard L. Williams

[57] ABSTRACT

A data compression system utilizes multiple encoding/decoding processing units arranged in a massively parallel systolic pipe array for compressing a stream of input characters received at an input end of the pipe. The systolic pipe executes data compression by textual substitution, converting the uncompressed stream of input characters into a compressed set of pointers representative of the input. The processors store a dictionary of strings of previously-read input characters in association with corresponding pointers. The processors match portions of the input stream with the stored strings, and transmit the corresponding pointers in place of the strings. In order to execute decoding or decompression of the stream of pointers, the processors maintain a dictionary identical to that generated during encoding. The processors match received pointers with stored strings of data and transmit the corresponding data strings in place of the pointers. Novel methods for matching, update, and deletion in a massively parallel systolic pipe structure enhance processing speed.

23 Claims, 6 Drawing Sheets

INDEXING SCHEME

- This is one possible indexing scheme. The indentations reflect the symmetry of the numbering sequence in the upper four bits.

```
chip01[801...87e] --> chip02[881...8fe] -->
    chip03[901...97e] --> chip04[981...9fe] -->
        chip05[a01...a7e] --> chip06[a81...afe] -->
            chip07[b01...b7e] --> chip08[b81...bfe] -->
                chip09[c01...c7e] --> chip10[c81...cfe] -->
                    chip11[d01...d7e] --> chip12[d81...dfe] -->
                        chip13[e01...e7e] --> chip14[e81...efe] -->
                            chip15[f01...f7e] --> chip16[f81...ffe] -->
                            chip17[101...17e] --> chip18[181...1fe] -->
                        chip19[201...27e] --> chip20[281...2fe] -->
                    chip21[301...37e] --> chip22[381...3fe] -->
                chip23[401...47e] --> chip24[481...4fe] -->
            chip25[501...57e] --> chip26[581...5fe] -->
        chip27[601...67e] --> chip28[681...6fe] -->
    chip29[701...77e] --> chip30[781...7fe]
```

- During encode chips 15 and 16 need f(hex) as their upper four bits; but during decode they need 0(hex) as their upper four bits. This is to be handled by the external control logic.

FIG. 6

METHOD AND APPARATUS FOR DATA COMPRESSION

BACKGROUND OF THE INVENTION

This invention relates generally to systems for digital data processing, and, more particularly, relates to highly parallel methods and apparatus for dynamic, high speed, on-line compression and decompression of digital data.

Data compression methods, most of which exploit the redundancy that is characteristic of data streams, are becoming an essential element of many high speed data communications and storage systems. In communications systems, a transmitter can compress data before transmitting it, and a receiver can decompress the data after receiving it, thus increasing the effective data rate of the communications channel. In storage applications, data can be compressed before storage and decompressed after retrieval, thereby increasing the effective capacity of the storage device.

Particular applications of data compression include magnetic and optical disk interfaces, satellite communications, computer network communications, interconnections between computers and attached devices, tape drive interfaces, and write-once media, where storage space reduction is critical.

Compression of data streams can be lossless or lossy. Lossless data compression transforms a body of data into a smaller body of data from which it is possible to exactly and uniquely recover the original data. Lossy data compression transforms a body of data into a smaller one from which an acceptable approximation of the original—as defined by a selected fidelity criterion—can be constructed.

Lossless compression is appropriate for applications in which it is unacceptable to lose even a single bit of information. These include transmission or storage of textual data, such as printed human language, programming language source code or object code, database information, numerical data, and electronic mail. Lossless compression is also used for devices such as disk controllers that must provide exact preservation and retrieval of uncorrupted data.

Lossy compression is useful in specialized applications such as the transmission and storage of digitally sampled analog data, including speech, music, images, and video. Lossy compression ratios are typically much higher than those attainable by purely lossless compression, depending upon on the nature of the data and the degree of fidelity required. For example, digitized speech that has been sampled 8,000 times per second, with 8 bits per sample, typically compresses by less than a factor of 2 with any lossless algorithm. However, by first quantizing each sample, which preserves acceptable quality for many applications, compression ratios exceeding 20 to 1 can be achieved. In contrast, typical lossless compression ratios are 3 to 1 for English text, 5 to 1 for programming language source code, and 10 to 1 for spreadsheets or other easily compressible data. The difference is even greater for highly compressible sources such as video. In such cases, quantization and dithering techniques may be applied in combination with otherwise lossless compression to achieve high ratios of lossy compression.

Among the most powerful approaches to lossless data compression are textual substitution methods, in which frequently-appearing data strings are replaced by shorter indexes or pointers stored in correspondence with the data strings in a dictionary. Typically, an encoder module and a decoder module maintain identical copies of a dictionary containing data strings that have appeared in the input stream. The encoder finds matches between portions of the input stream and the previously-encountered strings stored in the dictionary. The encoder then transmits, in place of the matched string, the dictionary index or pointer corresponding to the string.

The encoder can also update the dictionary with an entry based on the current match and the current contents of the dictionary. If insufficient space is available in the dictionary, space is created by deleting strings from the dictionary.

The decoder, operating in a converse manner, receives at its input a set of indexes, retrieves each corresponding dictionary entry as a "current match", and updates its dictionary. Because the encoder and decoder work in a "lock-step" fashion to maintain identical dictionaries, no additional communication is necessary between the encoder and decoder.

Thus, the input to the encoder of an on-line textual substitution data compressor is a stream of bytes or characters, and the output is a sequence of pointers. Conversely, the input to the decoder is a stream of pointers and the output is a stream of bytes or characters.

A common example of a textual substitution method is the publicly available COMPRESS command of the UNIX system, which implements the method developed by Lempel and Ziv. See J. Ziv, A. Lempel, "A Universal Algorithm for Sequential Data Compression," *IEEE Transactions on Information Theory*, Vol. IT-23, No. 5, pp. 337–343, 1977; and J. Ziv, A. Lempel, "Compression of Individual Sequences Via Variable Rate Coding," *IEEE Transactions on Information Theory*, Vol. IT-24, No. 5, pp. 530–536, 1978.

Textual substitution methods are generally superior to conventional methods such as Huffman coding. For example, the COMPRESS command of the UNIX system easily out-performs the COMPACT command of UNIX, which is based on Huffman coding.

Further examples of data compression methods and apparatus are disclosed in the following:

U.S. Pat. No. 4,876,541.

U.S. Pat. No. 4,814,746.

S. Henriques, N. Ranganathan, "A Parallel Architecture for Data Compression," *Proceedings of the IEEE Symposium on Parallel and Distributed Processing*, pp. 260–266, December 1990.

R. Zito-Wolf, "A Broadcast/Reduce Architecture for High-Speed Data Compression," *Proceedings of the IEEE Symposium on Parallel and Distributed Programing*, pp. 174–181, December 1990.

S. Bunton, G. Borriello, "Practical Dictionary Management for Hardware Data Compression," Apr. 2, 1990.

R. Zito-Wolf, "A Systolic Architecture for Sliding-Window Data Compression," *Proceeding of the IEEE Workshop on VLSI Signal Processing*, pp. 339–351, 1990.

C. Thomborson, B. Wei, "Systolic Implementations of a Move-to-Front Text Compressor," *Journal of the Association for Computing Machinery*, pp. 283–290, 1989.

J. Storer, *Data Compression*, Computer Science Press, pp. 163–166, 1988.

J. Storer, "Textual Substitution Techniques for Data Compression," *Combinatorial Algorithms on Words*, Springer-Verlag (Apostolico and Galil, ed.), pp. 111-130, 1985.

V. Miller, M. Wegman, "Variations on a Theme by Ziv and Lempel," *Combinatorial Algorithms on Words*, Springer-Verlag (Apostolico and Galil, ed.), pp. 131-140, 1985.

M. Gonzalez Smith, J. Storer, "Parallel Algorithms for Data Compression," *Journal of the Association for Computing Machinery*, Vol. 32, No. 2, pp. 344-373, April 1985.

U.S. Pat. No. 4,876,541 discloses a data compression system including an encoder for compressing an input stream and a decoder for decompressing the compressed data. The encoder and decoder maintain dictionaries for storing strings of frequently appearing characters. Each string is stored in association with a corresponding pointer. The encoder matches portions of the input stream with strings stored in the encoder dictionary, and transmits the corresponding pointers in place of the strings, thereby providing data compression. The decoder decompresses the compressed data in a converse manner. The system utilizes selected matching, dictionary update, and deletion methods to maintain processing efficiency.

U.S. Pat. No. 4,814,746 discloses a data compression method including the steps of establishing a dictionary of strings of frequently appearing characters, determining a longest string of the input stream that matches a string in the dictionary, transmitting the pointer associated with that string in place of the string, and adding a new string to the dictionary. The new string is a concatenation or linking of a previous matched string and the current matched string. The method also includes the step of deleting a least recently used string from the dictionary if the dictionary is full.

Henriques et al. discloses a systolic array of processors for executing sliding window data compression in accordance with the Ziv and Lempel method. Data compression is divided into parsing and coding. During parsing, the input string of symbols is split into substrings. During coding, each substring is sequentially coded into a fixed length code.

Zito-Wolf ("A Broadcast/Reduce Architecture for High-Speed Data Compression") discusses a data compression system utilizing a sliding window dictionary and a combination of a systolic array and pipelined trees for broadcast of input characters and reduction of results. In this system, for every character position of the input stream, the processor computes a pair (length, offset) identifying the longest matched string ending at that character.

Bunton et al. discusses data compression methods utilizing a dictionary tagging technique for deleting selected entries from the data compression dictionary. The TAG dictionary management scheme disclosed therein employs a structure known as a trie data structure with tagged nodes.

R. Zito-Wolf ("A Systolic Architecture for Sliding-Window Data Compression") discusses a systolic pipe implementation of textual substitution data compression utilizing a sliding window. The systolic-array architecture codes substrings of the input by reference to identical sequences occurring in a bounded window of preceding characters of the input, wherein the contents of the window form a dictionary of referenceable strings.

Thomborson et al. discloses systolic implementations of data compression utilizing move-to-front encoding. A move-to-front encoder finds the current ordinal position of a symbol in the input stream, transmits that ordinal position, and moves the symbol to the front of the list. A characteristic of this encoder is that more-frequently occurring input symbols will be at the front of the list.

Storer (1988) discusses parallel processing implementations utilizing the dynamic dictionary model of data compression. An ID heuristic is implemented for updating the dictionary, and a SWAP heuristic is executed for deleting entries from the dictionary to create space for new entries. The SWAP heuristic is implemented by doubling the storage elements and adding a controller to each end of the pipe, for switching input/output lines appropriately as the dictionaries are switched. A systolic pipe implementation utilizes a "bottom up" matching technique. In particular, as a stream of characters or pointers flows through the systolic pipe, longer matched strings are constructed from pairs of smaller matched strings. Each processor supports a FLAG bit that can be set during data compression to designate a "learning" processor in the pipe. The learning processor is the first processor along the pipe that contains a dictionary entry.

Storer (1985) discusses off-line and on-line data compression methods utilizing textual substitution in which pointers are transmitted in place of character strings. An on-line implementation described therein utilizes an encoder and decoder, each having a fixed amount of local memory forming a local dictionary. Another implementation utilizes a systolic array of processing elements utilizing a sliding dictionary to match strings in the input stream. The sliding dictionary stores the last N characters processed in the systolic pipeline, one character per processing element. The dictionary is updated by sliding old characters to the left in order to bring in new characters.

Miller et al. (1985) discusses enhancements to the data compression methods of Ziv and Lempel, including a dictionary replacement strategy that enables the use of a fixed size dictionary, methods for using a larger class of strings that can be added to the dictionary, and techniques that avoid uncompressed output.

Gonzalez-Smith et al. discloses systolic arrays for parallel implementation of data compression by textual substitution. The systems described therein implement a sliding dictionary method, in which characters being read in are compared with each of the elements of a dictionary that spans the N characters preceding the current character.

These publications accordingly disclose various systems for data compression. However, one deficiency shared by conventional data compression methods and systems, such as those described above, is the tradeoff between the benefits of data compression and the computational costs of the encoding and subsequent decoding. There exists a need for data compression systems that provide high compression ratios and high speed operation, without necessitating complex encoding and decoding modules.

It is thus an object of the invention to provide lossless data compression systems utilizing massively parallel architectures to compress and decompress data streams at high rates, and with high compression ratios.

It is a further object of the invention to provide such methods and apparatus that can be embodied in relatively simple, low-cost digital hardware.

A further object of the invention is to provide data compression methods and apparatus that dynamically adapt to changing data streams.

Other general and specific objects of the invention will in part be obvious and will in part appear hereinafter.

SUMMARY OF THE INVENTION

The foregoing objects are attained by the invention, one aspect of which provides a data compression system utilizing multiple encoding/decoding processing units arranged in a systolic pipe array for compressing a stream of input data received at an input end of the pipe.

The systolic pipe executes data compression by textual substitution, converting the uncompressed stream of input data into a compressed set of pointers representative of the input. The processors store a dictionary of previously-read strings of input data in association with corresponding pointers- The processors match portions of the input stream with the stored strings, and transmit the corresponding pointers in place of the strings.

In order to execute decoding or decompression of the stream of pointers, the processors maintain a decoding dictionary identical to that generated during encoding. The processors match the pointers with stored strings of data, and transmit the corresponding data strings in place of the pointers.

A further aspect of the invention utilizes selected matching, update, and deletion methods to increase processing efficiency. The matching methods can include a modified "greedy" heuristic; the updating feature can include an implementation of a modified "identity" ("ID") heuristic; and the deletion methods include a "swap" heuristic.

One practice of the invention utilizes a "bottom up" approach to finding the longest possible match between the input stream and a stored string, in which successively longer match strings are constructed from shorter matches.

The invention will next be described in connection with certain illustrated embodiments; however, it will be clear to those skilled in the art that various modifications, additions and subtractions can be made without departing from the spirit or scope of the claims.

DESCRIPTION OF THE DRAWINGS

For a fuller understanding of the nature and objects of the invention, reference should be made to the following detailed description and the accompanying drawings, in which:

FIG. 6 is a schematic diagram of an indexing sequence utilized in one practice of the invention.

DESCRIPTION OF ILLUSTRATED EMBODIMENTS

Figure 1:
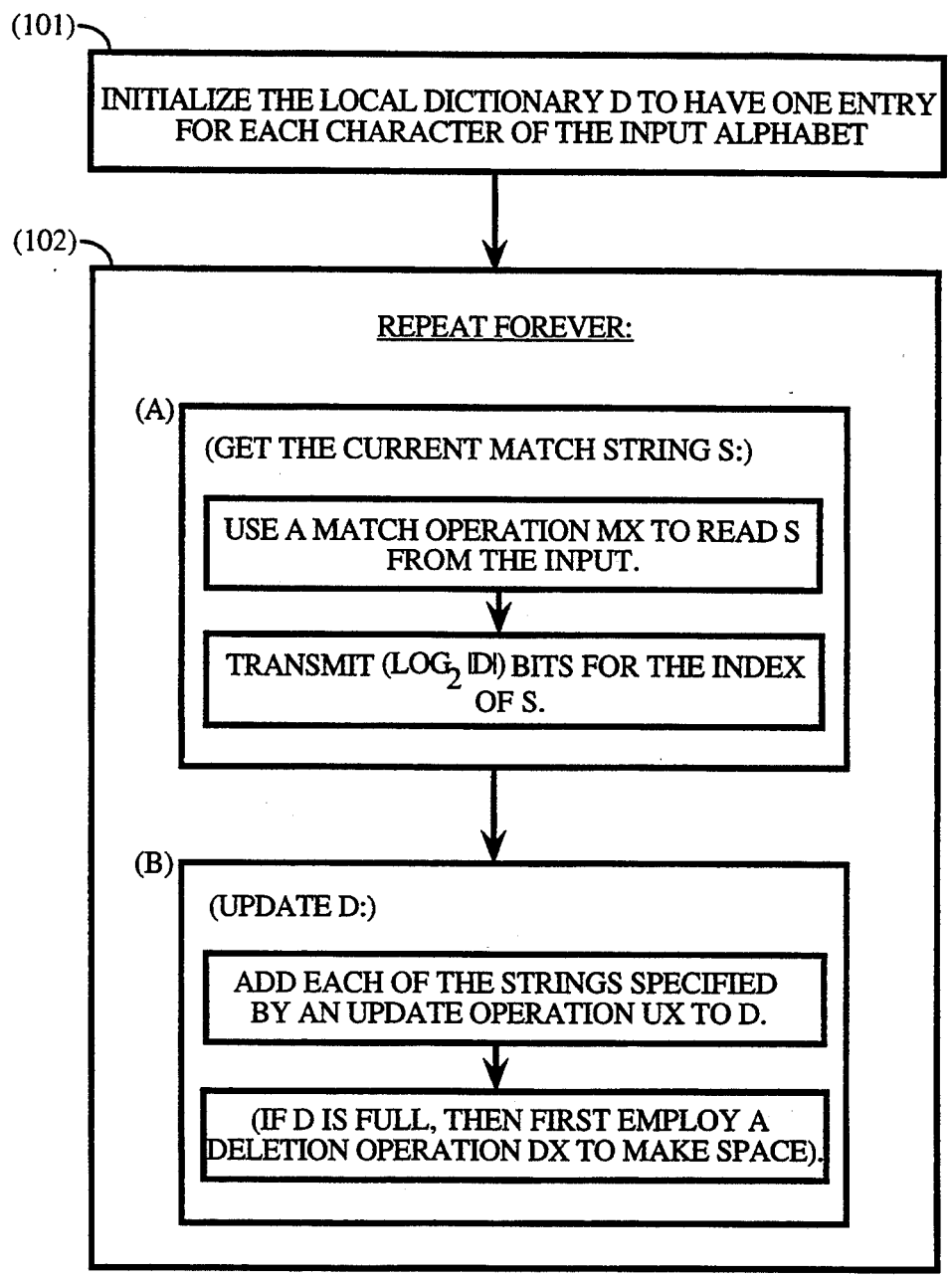
FIG. 1 is a flow chart of the overall data compression/encoding method of the invention.
Figure 2:
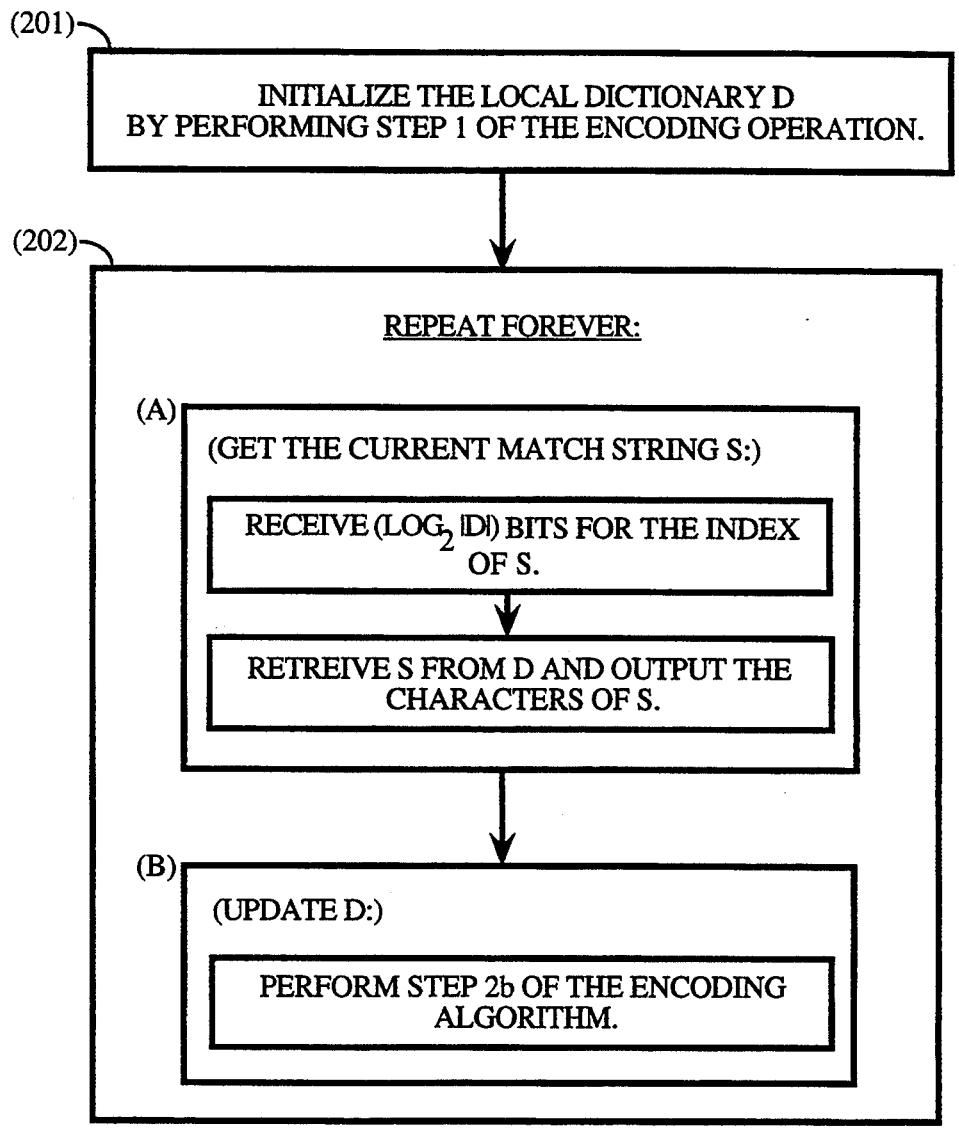
FIG. 2 is a flow chart of the overall data decompression/decoding method of the invention.
Figure 3:
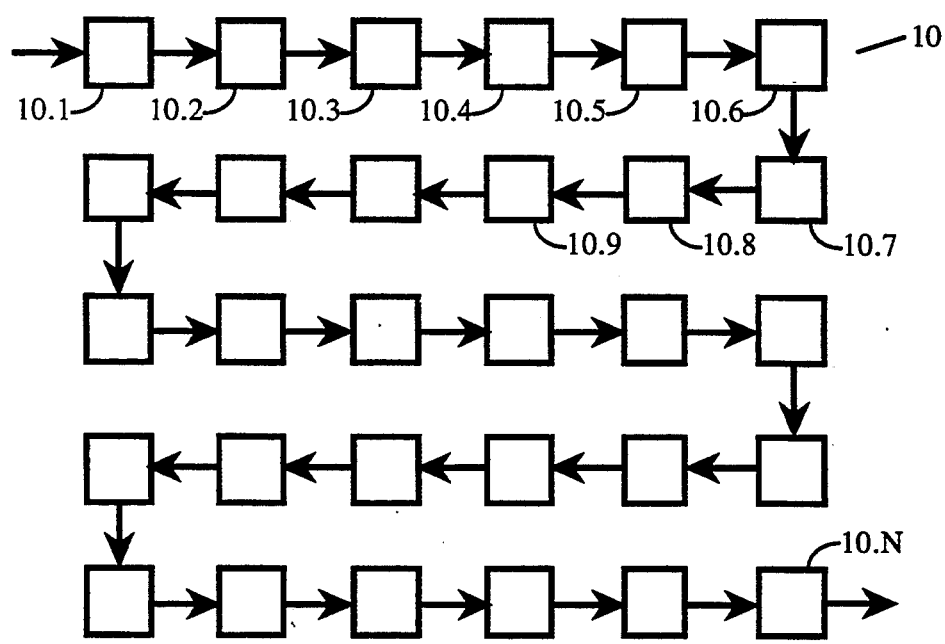
FIG. 3 is a schematic diagram of a systolic pipe for data compression in accord with the invention.

Overview: FIGS. 1–3 depict the overall structure and function of a data compression system constructed in accord with the invention. In particular, FIGS. 1 and 2 are flow charts of encoding and decoding operations utilizing on-line dynamic textual substitution. The encoding operation depicted in FIG. 1 reads a stream of characters and writes a compressed stream of corresponding bits, while the decoding operation depicted in FIG. 2 receives the compressed stream of bits and generates a stream of corresponding characters.

FIG. 3 shows the systomic pipe structure of a data compression system constructed in accord with the invention, for executing the method steps depicted in FIGS. 1 and 2. A systolic pipe is a linear array of processors in which each processor communicates only with left and right adjacent processors. As indicated in FIGS. 1–3, the invention provides a massively parallel, systolic pipe multiprocessor system that compresses data by means of textual substitution.

Parallel implementations of dynamic textual substitution were previously thought to require data broadcast or other complex global communication. The invention, however, exploits the massively parallel nature of the systolic pipe to execute dynamic textual substitution at high speed, without complex interprocessor connections.

Encoding/Decoding: These advantages are provided by implementation of the steps depicted in FIGS. 1 and 2. As indicated therein, the encoder and decoder each have a fixed, finite quantity of local memory forming a local dictionary D. The two local dictionaries are initialized at a time TO to be empty. During encoding and decoding operations, the dictionaries change dynamically, and are maintained by a novel variant of an identity ("ID") update technique, a SWAP deletion technique, and a "bottom up" parallel version of the "greedy" match technique. These methods are discussed in detail hereinafter.

The illustrated methods and apparatus constitute a real-time, on-line data compression system. In an on-line system, neither the sender nor the receiver can "see" all of the data at once. Data are constantly passed from the sender through the encoder, then through the decoder, and on to the receiver. The encoding and decoding operations shown in FIGS. 1 and 2 satisfy the requirements of the following definition: an on-line compression/decompression method is real-time if there exists a constant k (which is independent of the data being processed or the size of the dictionary) such that for every k units of time, exactly one new character is read by the encoder and exactly one character is written by the decoder.

The only exception to this rule is the allowance of a small "lag" between the encoder and decoder. Thus, there exists another constant L (that is independent of the data being processed) such that (i) during the first L units of time the decoder produces no characters, and (ii) given an input of finite length, L time units may elapse between the time that the encoder has finished reading characters, and the time that the decoder is finished transmitting characters.

Further explanation of the invention is simplified by assuming that the input date stream is a sequence of 8-bit characters. The set of all possible characters, i.e., the integers 0 through 255, is referred to herein as the input alphabet S. In addition, data handling in compressed form is assumed to be noiseless, such that no bits are added, lost, or changed. While this assumption is made for convenience, those skilled in the art will recognize that known error detection and correction techniques can be utilized to ensure that no bits are corrupted or lost.

The input data stream is then encoded by executing the following steps, as depicted in FIG. 1:

(101) Initialize the local dictionary D to have one entry for each character of the input alphabet. (102) repeat forever:

(a) (Get the current match string Use a match operation MX to read s from the input. Transmit $[\log_2|D|]$ bits for the index of s.

(b) (Update D:) Add each of the strings specified by an update operate UX to D (if D is full, then first employ a deletion operation DX to make space).

The compressed stream can then be decoded by executing the following steps, as depicted in FIG. 2:

(201) Initialize the local dictionary D by performing Step 1 of the encoding operation.

(202) repeat forever:

(a) (Get the current match string s:) Receive $[\log_2|D|]$ bits for the index of s. Retrieve s from D and output the characters of s.

(b) (Update D:) Perform step 2b of the encoding algorithm.

The encoding and decoding operations of FIGS. 1 and 2 are executed in lock-step to maintain identical copies of the constantly changing dictionary D. The encoder repeatedly finds a match between the incoming characters of the input stream and the dictionary, deletes these characters from the input stream, transmits the index of the corresponding dictionary entry, and updates the dictionary. The dictionary update operation, described hereinafter, generates an update string that is a function of the current contents of the dictionary and the most recent match. If insufficient space is available in the dictionary for updating, a deletion operation must be performed, as discussed in below.

Similarly, the decoder repeatedly receives an index, retrieves the corresponding dictionary entry as the "current match", and then executes the same operation as the encoder to update its dictionary.

In accordance with the invention, the number of entries in the dictionary D can be varied. The term $D_{max}$ is used herein to denote the maximum number of entries that the dictionary D may contain. A typical value is $D_{max}=4,096$. Experimental simulations indicate that this value permits the system to achieve most of the compression attainable by the underlying encoding/decoding method, while providing a reasonable limit on the number of entries in the dictionary. In one practice of the invention, the local dictionary D utilizes a data structure in which each dictionary entry occupies a constant amount of data space, independent of the actual length of the corresponding string.

MX UX, DX: In executing the steps depicted in FIGS. 1 and 2, the invention performs the following operations:

The match operation, MX: This operation removes from the input stream a string "s" that is contained within the dictionary D. Since the characters of S are implicitly in D and can never be deleted, there is always at least one such s.

The update operation, UX: This operation that takes the local dictionary D and returns a set of strings that should be added to the dictionary if space can be found for them.

The deletion operation DX: This operation takes the local dictionary D and returns a string of D that may be deleted.

In accordance with the invention, the following methods are utilized for the matching, updating, and deleting tasks:

The match operation MX provides an approximate determination of the longest possible match string, utilizing a modified "greedy" match heuristic (which takes the longest possible match between the input stream and a string in D) in conjunction with a "bottom up" technique, in which longer match strings are constructed from shorter matches.

The update operation UX employs a modified version of an identity (ID) technique. A typical ID operation adds the previous match concatenated with the current match. In conventional data compression systems, the ID technique required complex data structures that were characterized by undesirable worst-case properties. However, by employing a modified ID technique in conjunction with the massively parallel architecture depicted in FIG. 3, the invention avoids the need for complex data structures. The modified ID method is described hereinafter.

Figure 5:
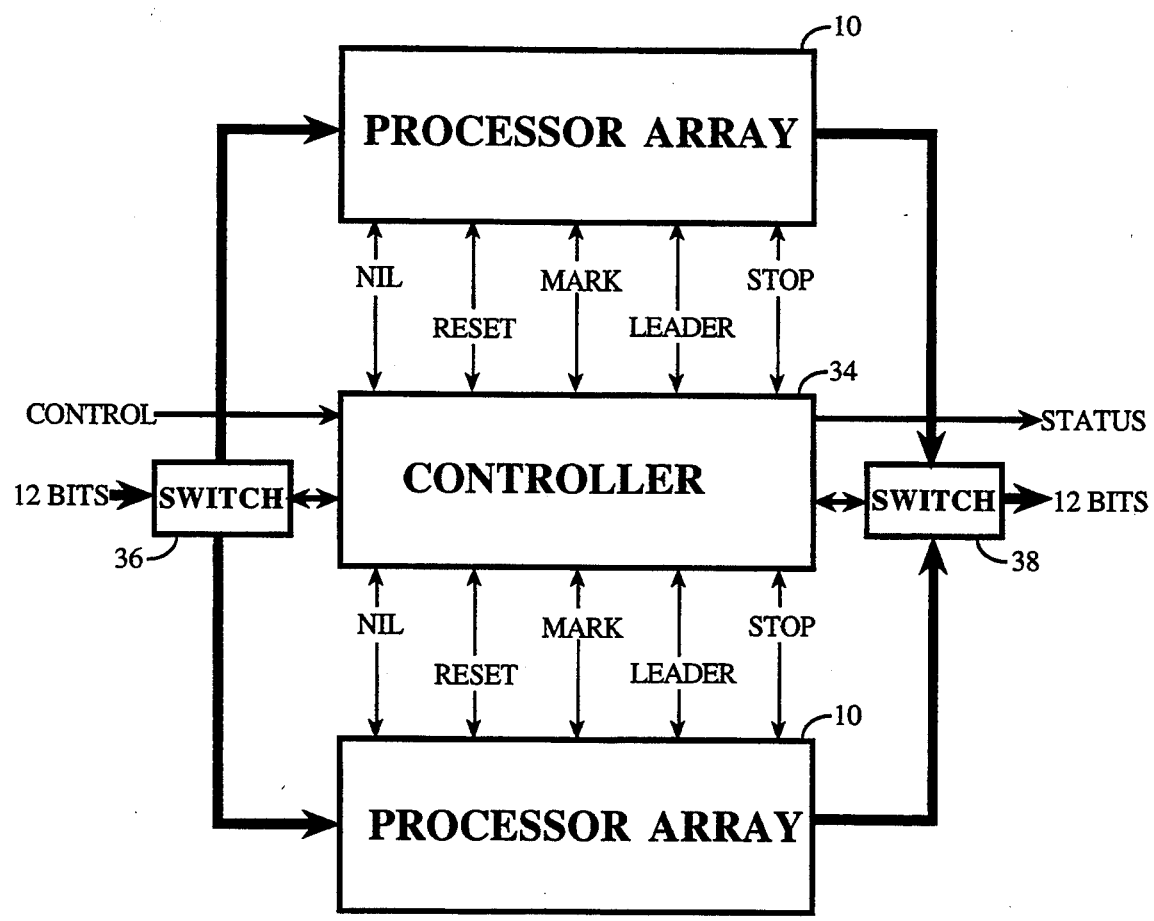
FIG. 5 is a schematic diagram of a complete data compression system constructed in accordance with the invention, including two processor arrays and controller logic for executing a SWAP operation.

In one practice of the invention, the deletion operation DX employs a SWAP technique that utilizes primary and auxiliary dictionaries. When the primary dictionary first fills to capacity, an auxiliary dictionary is started, but compression based on the primary dictionary is continued. From this point on, each time the auxiliary dictionary becomes full, the roles of the primary and auxiliary dictionaries are reversed, and the auxiliary dictionary is reset to be empty. A structure for providing this function is depicted in FIG. 5, using two identical copies of the systolic pipe architecture (10, 10'), in conjunction with conventional control logic elements (34, 36, 38) for switching the roles of the primary and auxiliary dictionaries.

Those skilled in the art will appreciate that the invention can be implemented using other DX methods. Alternatives for DX include the known FREEZE method, in which the dictionary remains unchanged after it fills to capacity, and the conventional LRU (least recently used) method, in which the processors delete the least recently matched dictionary string. The FREEZE heuristic, however, can be unstable if the data characteristics change after the dictionary fills. Moreover, the SWAP method described above in connection with FIG. 5 is better adapted for parallel implementations than is an LRU technique.

Systolic Pipe: As indicated in FIG. 3, a preferred embodiment of the invention executes the above-described method steps using a systolic pipe 10. The pipe 10 includes a linear array of processors 10.1, 10.2, 10.3, ..., 10.N, each connected only to left and right adjacent processors. The "snake" arrangement depicted in FIG. 3 can implement textual substitution methods at much higher data rates than are achievable in serial structures.

A simple example of a systolic pipe is an automobile assembly line, which may produce a new automobile every twenty minutes even though each car is in the assembly line for a day. Although each station in the automobile assembly line performs a different task, the stations are at least conceptually identical, if we view them all as taking as input a partially built car, performing an elementary operation (such as welding), and then transmitting a partially completed car to the next station.

From the standpoint of VLSI fabrication and operation, a systolic pipe has a number of desirable properties. For example, all processors can be identical, and the length of connections between adjacent processors can be bounded by a constant. The systolic pipe structure can be set out in a linear array such that power and ground pathways can be routed without crossing wires. Additionally, the layout strategy can be independent of the number of chips used. A larger pipe can be obtained by placing as many processors as possible on a chip and, using the same layout strategy, placing as many chips as possible on a board.

Figure 4:
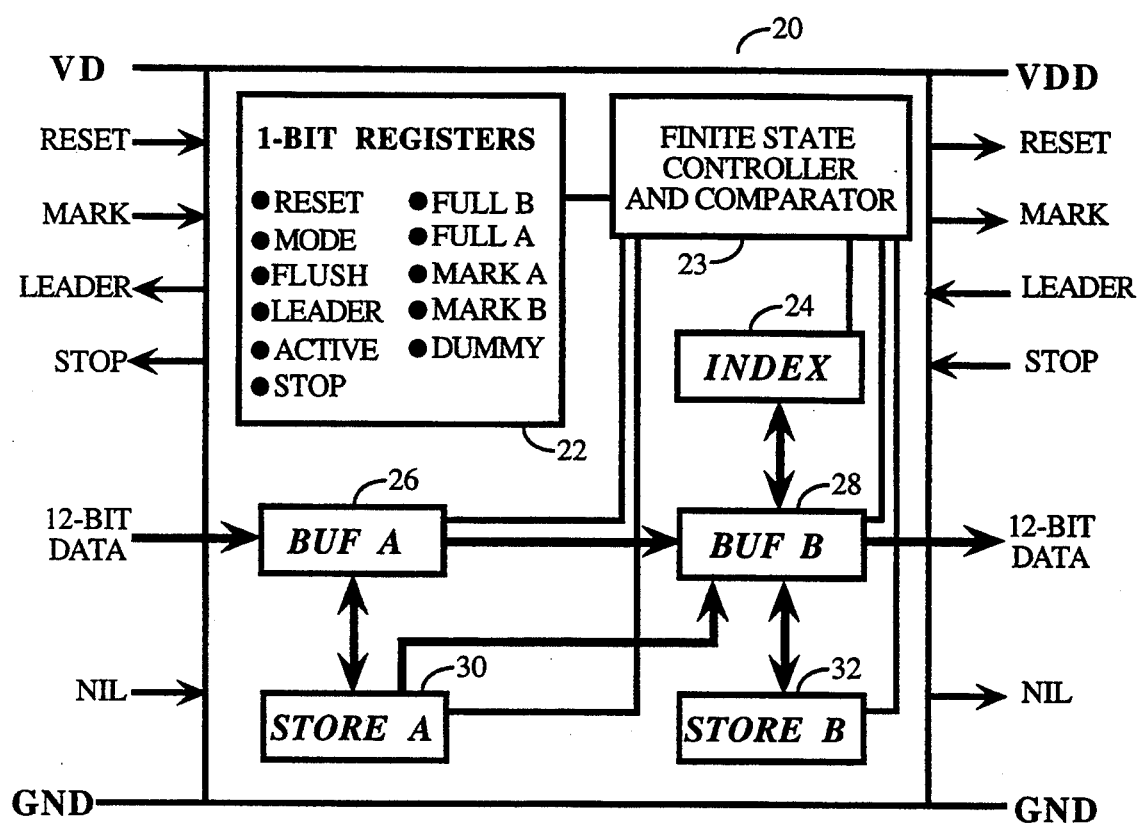
FIG. 4 is a schematic diagram of a processor in the systolic pipe of FIG. 3.

Processors: The processors (10.1, 10.2, 10.3, . . . , 10.N) indicated in FIG. 3 can be, in principle, any computational device, including a main-frame computer. However, as depicted in FIG. 4, one practice of the invention utilizes processors that are extremely simple, consisting of registers 22, 24, 26, 28, 30, 32, and a comparator and finite-state logic module 23. The processor 20 depicted in FIG. 4 includes several one-bit registers 22, referred to as RESET, MODE, FLUSH, LEADER, ACTIVE, STOP, FULL_B, FULL_A, MARK_B, and DUMMY. The LEADER BIT, STOP BIT, and MARK BITS are discussed in detail below. The processor also includes four twelve-bit registers 26, 28, 30, 32 referred to as BUF_A, BUF_B, STORE_A and STORE_B, respectively. The registers 22, 24, 26, 28, 30, 32, and the comparator and finite-state logic 23 are conventional in design, and are constructed in accordance with standard engineering practice.

Systolic Pipe Encoding: The encoding operations of the systolic pipe will now be discussed with reference to FIGS. 3 and 4. As indicated in FIG. 3, the pipe 10 contains a plurality of processors 10.1, 10.2, 10.3, . . . , 10.N. During encoding, data passes through the pipe from left to right, entering at the leftmost processor 10.1 and exiting at the rightmost processor 10.N.

The pipe stores a representation of the dictionary in which each dictionary entry is represented by a pair of multi-bit digital pointer values that point to two other entries, or to single characters. In one practice of the invention, all pointers are represented by the same number of bits; the bits for each input character are "padded" to the left with zeros to form the corresponding pointer and sent into the left end of the pipe. In a VLSI embodiment of the invention discussed hereinafter, each input character of 8 bits is padded to the left with 4 zeros to form a 12 bit pointer.

Referring to FIG. 4, each processor in the pipe is capable of holding a dictionary entry—i.e., a pair of pointers stored in the processor's 12-bit registers—and each processor has an associated index stored in index register 24. The range of index values, and the number of processors in the pipe, are a function of S (the input alphabet) and $D_{max}$ (the maximum number of entries that the dictionary D may contain). No processors are provided for indices O through $|S|-1$, because the characters of the input alphabet S are always implicitly in the dictionary. Additionally, there is no processor numbered $D_{max}-1$. This value is instead used for the NILPOINTER discussed below. Thus, the processors have indexes $|S|$ through $D_{max}-2$, from left to right (corresponding to processor elements 10.1, 10.2, 10.3, . . . , 10.N in FIG. 3), and the total number of processors in the pipe is equal to $D_{max} - |S| - 1$. The processors are numbered so that if $i<j$, then processor i is to the left of processor j and occurs earlier in the pipe than processor j.

As indicated in FIG. 4, a one-bit LEADER register is provided in register module 22 of each processor in the pipe. The LEADER BIT is initially ONE for the leftmost processor and ZERO for all others. It is always the case that at most one processor is the LEADER PROCESSOR, that the processors to its left contain dictionary entries, and that processors to its right are empty.

As the data stream passes through the processors to the left of the LEADER PROCESSOR, it is encoded. In particular, whenever a pair of pointers enter a processor and matches the pair of pointers stored in the storage registers of that processor (see FIG. 4), that pair of pointers is removed from the data stream and replaced by a single pointer—the index of that processor. Specifically, upon detection of a match, the index stored at index register 34 is pushed down into the BufB register 28. Data passes unchanged through the processors to the right of the LEADER PROCESSOR. When a pair of pointers enters the LEADER PROCESSOR, they represent adjacent substrings of the original data referred to as the "previous" match and the "current" match. The LEADER PROCESSOR can simply adopt this pair of pointers as its entry, set its LEADER BIT to ZERO, and send a signal to the processor to its right to set its LEADER BIT to ONE.

In contrast to methods utilized in serial data processing, this is referred to as a "bottom up" approach to finding a maximal match, because longer matches are built from smaller matches.

The new LEADER PROCESSOR must not adopt the same pair of pointers that was just adopted by the processor to its left. Accordingly, when a processor first becomes the LEADER PROCESSOR, it must allow one pointer to pass through before proceeding to "learn."

When the rightmost processor becomes the LEADER PROCESSOR, it adopts a pair of pointers as its entry and then sends a signal to the right to pass on the LEADER BIT. This signal indicates that the dictionary is full. At this point, utilizing the configuration depicted in FIG. 5, the SWAP deletion heuristic can be implemented. As indicated in FIG. 5, two systolic pipelines 10 and 10' like that depicted in FIG. 3 communicate through a controller 34 and switches 36 and 38. The controller 34 receives and transmits NIL, REST, MARK, LEADER, and STOP signals from the processor arrays. Dictionary entries are transmitted between arrays 10, 10' through switches 36, 38 in response to signals asserted to the switches 36, 38 by controller 34. Thus, the SWAP technique is implemented by controller 34 and switches 36, 38, utilizing the two identical copies of the pipe 10, 10'. The controller 34 utilizes conventional logic elements to route input/output lines appropriately as the dictionaries exchange places.

Decoding: Referring again to FIGS. 3 and 4, the pipe depicted therein executes both encoding and decoding. During decoding, data still enters from the left and leaves to the right. However, the numbering of processors is reversed, such that the rightmost processor is numbered $|S|$. Processor indices are sent down the pipe by the controller into the index registers upon power-up, or upon a RESTART that causes a change between encoding and decoding modes. Operation of the decoding pipe is essentially the reverse of the encoding pipe.

Processor |S| is initially the LEADER PROCESSOR, and the remaining processors are empty. Compressed data enters from the left, passes through the empty processors unchanged, and is decoded in the non-empty portion of the pipe. In particular, when a pointer arrives at a processor that is equal to the processor index, it is replaced by the two pointers stored by that processor. The LEADER BIT propagates from right to left—the opposite of the direction of propagation during encoding.

It is an inherent aspect of data compression that there may be no reasonable bound on how far the number of decompressed bits exceeds the number of compressed bits. This potential problem is addressed in the invention by employing a STOP BIT (FIGS. 4 and 5) that is transmitted by a given processor to the processor to its left, to signal that no more data should be sent until the STOP BIT is turned off. As indicated in FIG. 4, each processor has a buffer capable of holding two pointers, in its BUF_A and BUF_B registers. A typical sequence of events for a decoding processor would be the following:

1. The input buffer currently contains one pointer that is not the same as the processor index; the STOP BIT from the processor to the right is not set.
2. A clock cycle occurs; the current pointer in the buffer is sent to the right and a new pointer is read into the buffer.
3. The new pointer in the buffer is the same as the processor index. This pointer is replaced bV the first of the two pointers stored in the processor memory and the STOP BIT is set.
4. A clock cycle occurs. The pointer in the buffer is transmitted to the right. Although a STOP BIT is now being transmitted, the processor to the left has not yet encountered the STOP BIT, and another pointer arrives. The second pointer in the processor memory is placed in the buffer before the pointer that just arrived. The buffer now contains two pointers.
5. A clock cycle occurs and the first of the two pointers in the buffer is transmitted to the right (no new pointer arrives from the left since the STOP BIT was set on the last clock cycle). The STOP BIT is un-set.
6. A clock cycle occurs, the pointer in the buffer is sent to the right, and a new pointer arrives from the left.

Thus, referring again to FIG. 4, if a match is detected during decoding, the processor can upload StoreB and StoreA into BufB and BufA, respectively, and transmit a STOP BIT to the left.

If the STOP BIT is sent from the leftmost processor to the communication line, this event can be handled by generating a conventional XON/XOFF protocol signal. The signal is transmitted to the data source, thereby turning off the source for a time.

Those skilled in the art will appreciate that the use of the STOP BIT requires no signal propagation. On each clock cycle, the only communication occurs between a processor and the processors to its immediate left and right.

Decoder Learning: One simple method of decoder learning is to execute essentially the same operations as the encoder. The deficiencies of this simple implementation, however, are demonstrated by the following example. Suppose that four pointers are propagating down the pipe: pointer X, followed by pointer W, followed by pointer V, followed by pointer U. Consider what occurs when pointers W and X have arrived at the LEADER PROCESSOR. The LEADER PROCESSOR adopts the entry WX and then passes leadership to the left. The processor to the left waits until pointers U and V have arrived and then adopts the entry UV. The encoder would have also learned the entries UV and WX, and would have additionally learned the entry VW. The entry VW will be "lost" by this simple implementation of the decoder.

This problem can be remedied by interspersing a NILPOINTER between every pointer in the input stream to the decoder. As noted above, the processor numbered $D_{max}$ - 1 has been omitted from the pipe. The corresponding pointer value (which is all ONEs when $D_{max}$ is a power of two) is the NILPOINTER. The effect of interspersing NILPOINTERS is to slow down the operation of the decoder to allow time for the "overlapping" entries such as VW to be learned. The interspersion of NILPOINTERS is necessary only during the learning period when not all processors have adopted an entry. The output data rate from the decoder is unaffected so long as the data has been compressed by at least a factor of two.

Experiments conducted in conjunction with one embodiment of the invention indicate that learning every other entry provides compression equivalent to learning every entry. Thus, one practice of the invention utilizes the simple decoder implementation described above, while modifying the encoder to also learn only every other entry. In accord with this practice, while the original rule for a LEADER in the encoder was to adopt a pointer pair only if at least one of the pair was not adopted by the preceding LEADER PROCESSOR, the modified rule is to adopt a pointer pair only if neither pointer was adopted by the preceding processor.

This modified version of the ID heuristic is implemented by marking a pointer by passing an extra bit—referred to as a MARK BIT—along with each pointer once it has been adopted by a LEADER PROCESSOR. This could also be achieved by waiting for two pointers to pass by before attempting to adopt. As indicated in FIG. 4, the MARK BIT is transmitted by a given processor to the processor on its right to mark the adopted pointer. The MARK BIT is also useful for finite state control purposes.

The FLUSH Operation: The NILPOINTER is also utilized during a FLUSH operation, to record the FLUSH operation in the compressed data stream. During a FLUSH operation, a FLUSH signal (FIG. 4) is transmitted down the encoding pipe to expel all data out of the pipe. A FLUSH operation can be employed to initiate a new input stream that will utilize a new dictionary. It is not necessary to wait for a FLUSH to propagate through the entire pipe before starting a new input stream. Instead, after one clock cycle, new data can "follow" the FLUSH that is expelling old data.

The controller element depicted in FIG. 5 can monitor compression ratios, and when the ratio falls below a selected threshold, the controller can execute a FLUSH operation to cause the pipe to learn a new dictionary. As noted above, the FLUSH operation and new learning operation can occur without stopping the pipe.

FLUSH operations can also be employed to signal that there is a pause in the input stream. Consider the example of a satellite that transmits data to earth continuously for one day, and then pauses for a short period of time while a sensor is adjusted. Rather than require the ground-based receiver to wait for the data that is left in the pipe, a FLUSH signal can be sent to push out the data. The dictionary that has been learned remains in the pipe.

Each time a FLUSH occurs, a single NILPOINTER is stored in the compressed data stream so that when decoding, FLUSH operations can be performed at the same relative points that they were executed during encoding, thus ensuring proper decoding of the data.

A Massively Parallel VLSI chip: A VLSI chip embodying the invention has been constructed and tested. The chip is a 1.0 micron double metal CMOS construction with a 68-pin LCC package (48 pins for signals, 20 pins for power and ground), having a die size of 9.650 by 10.200 microns (0.38 by 0.40 inches), and power consumption of 750 milliwatts. The consumption is evenly distributed, and the chip has no "hot" spots. The chip includes approximately 350,000 transistors forming 128 processing elements, processing 8 bits per clock cycle.

A prototype compression/decompression board was constructed with thirty of these chips interconnected to create a complete encoding/decoding pipe of 3,839 processing elements. This structure is depicted in FIG. 5, with control logic constructed in accord with known engineering principles. Using a 20 megahertz clock, with the prototype board reading or writing a new byte on every clock cycle, the board operates at 160 million bits per second. This speed was attained using relatively conventional VLSI technology. Those skilled in the art will appreciate that this speed can be increased by improved chip technology, to rates approaching 600 million bits per second.

The packaged chips are less than 1 inch square. Due to the extremely simple pattern of interconnections, with communication only between a chip and the chips to its immediate left and right, a board area of approximately 5 by 6 inches would accommodate the 30 chips that form the complete systolic array of 3,389 processing elements. Smaller areas are possible with multiple chip packaging.

To speed completion time and reduce costs, the design process was kept simple, with standard cell construction, and the size of the chip was kept relatively modest. Current technology would enable the use of less area per processing element, more processing elements per chip, and higher processing speeds. Simulations indicate that the maximum delay time of a single cell is only 13 nanoseconds, so a clock rate of up to 75 megahertz may be possible with current technology, yielding a data rate of 600 million bits per second.

The preceding description sets forth the basic structure and operation of the invention. The following discussion addresses further aspects of the invention that advantageously resolve certain practical issues.

Implicit LEADER BIT: In the embodiment described above in connection with FIGS. 3 and 4, leadership is explicitly passed from left to right in the encoder pipe by means of a LEADER BIT. However, since MARK BITS are already used in the pipe structure to indicate whether a pointer has participated in a learning step, leadership can be passed implicitly—without the explicit use of a LEADER BIT—by treating all empty processors as LEADERS. Because only unmarked pointers can be "adopted" by a processor, and all pointers that are adopted are then marked, only the leftmost empty processor will perform learning at a given step. The remaining empty processors to the right can be considered LEADERS but will take no action.

Flexible Processor Ordering and Usage: As discussed above, indices are dynamically loaded into the processor index registers 24 (FIG. 4) at start-up. Any ordering of the processors can be utilized, so long as the numbering used by the encoder is reversed by the decoder. An index value that is not used by a processor is used to encode the NILPOINTER. The invention permits any combination of indices to be unused by processors and reserved for other uses in the encoder, so long as the same combination of index values is employed in the decoder.

Static Indexing Scheme: By choosing the ordering of processors to be symmetric about a center, as shown in FIG. 6, a static indexing scheme can be employed and the space required for the processor index registers 24 (FIG. 4) can be eliminated. The ordering shown in FIG. 6 is but one possible static indexing scheme. The indentations in the drawing figure reflect the symmetry of the numbering sequence in the upper four bits of each index.

Employing the processor ordering depicted in FIG. 6 allows the elimination of a dynamic index register and the concomitant logic elements to load and address the register. Instead, the processor index can be "hardwired," and this static ordering can then be reversed for decoding by simply complementing the index bits. The one exception to this complement function is the upper 4 bits of the two center processors, which are always set to 1111. The symmetric ordering depicted in FIG. 6 compensates for the fact that indices 0–255 are not explicitly present in the array, by placing in the center the indices having 1111 as their high order bits.

During encode operations, chips 15 and 16 in the illustrated embodiment require f[hex] as their upper four bits, but during decoding, chips 15 and 16 require 0[hex] as their upper four bits. Those skilled in the art will appreciate that this change can be handled in a conventional manner by external control logic.

In order to permit a symmetric implementation of the NILPOINTER (i.e., an unused index), the first and last index of every set of 128 indices are unused. For example, indices 800, 87f, 880, 8ff, . . . , 7ff are omitted. Experimentation has demonstrated that the effect of eliminating sixty indices has a negligible effect on compression, while having the added benefit of providing additional values that can be used for special purposes.

Dummy Processors: In the embodiments of the invention described above, each processor has an associated index value. However, the invention also permits the utilization of processors that are not associated with any index. These processors, referred to as dummy processors, provide a means for using identical VLSI chips even when the total number of chips is not an exact divisor of the total size of the pipe. Dummy processors are also useful in providing a fault-tolerant capability.

Fault-Tolerant Capability: A key feature of the invention is that the pipe consists of a long array of identical processors or cells. A defect in a chip that contains a plurality of cells may only destroy one or two cells. Additional routing circuitry can be incorporated into the pipe structure so that the data path can be routed around a given cell that may be defective.

When a chip defect affects only a cell and not part of the data path between cells, the system can locate the defective cell at start-up time by successively compressing a standard test data file, initially using only the first processor (and routing around the rest), then only the first two processors, and so on, permanently routing around a bad cell whenever compressed data (or decompressed data when checking decoding circuitry) is found to be incorrect.

By maintaining a few extra cells on each chip, the extra cells can be used to replace defective cells. If there are any cells left over after replacement of defective cells, they can be designated as dummy cells. since the percentage of chip area used for data path is low compared to the percentage used for cells, simulations show that this moderate redundancy in construction can significantly increase chip yield with only a very small increase in chip size.

Pad Buffering: Where VLSI chip technology permits, all cells of the systolic pipe can be placed on a single chip VLSI chip. In a typical practice of the invention, however, the cells of the pipe are placed on several chips. For example, in the prototype board discussed above, each chip contains 126 cells and 30 chips are provided on the prototype board. Given current VLSI technology, significant delays can arise in transmitting signals on and off each chip, due to delays in propagation through the pads of each chip. Accordingly, buffer latches are added to the front and end of the array of cells on a chip, to reduce the required cycle time, from the sum of both pad propagation time and cell propagation time, to the greater of either pad time or cell time. Because pad time and cell time are nearly equal in conventional VLSI devices, this technique can nearly double chip speed. Additionally, a latch can be placed between every pair of cells on a chip to insure correct timing of the STOP and LEADER BITS that propagate in the right-to-left direction in the decoder.

In another practice of this invention, the need for placing latches between every pair of processors is eliminated. In particular, the STOP BIT lines from the leftmost three processors are tied together, so that if any one of the three signals a STOP, the chip will signal a STOP to its left. To handle the LEADER BIT, the board-level controller periodically pauses the input to create two pointer "gaps" at appropriate points, to give the STOP BIT one extra clock cycle to move from one chip to another. This has the effect of slowing the input to the decoder by less than one percent, and has no effect on its output, provided the data has been compressed by at least one percent.

Multiple Entries per Cell: In the embodiment described above in connection with FIGS. 3 and 4, each cell in the systolic pipe contains exactly one dictionary entry. In this case, approximately one-half the area of a given processor is dedicated to finite state control. Processor space can be saved by storing several entries in each cell. This increases the size of each cell, but reduces the required number of cells, thereby providing a net savings in hardware. If the number of entries per cell is not too large—for example, sixteen entries suffice to reduce the fifty percent overhead of finite state control to three percent—then a parallel comparison to all entries in a cell within a single clock cycle is possible with current VLSI technology. Thus, the speed penalty associated with utilizing multiple entries per cell is not significant.

Other Learning Strategies: As described above, a simple implementation of the invention employs a modified version of the identity ("ID") learning technique. The invention can also utilize other learning methods wherein a given dictionary entry is determined by two other entries. For example, a modified version of the first character ("FC") learning method, wherein the processors add the last match concatenated with the first character of the current match, is readily implemented by tagging pointers that pass through the pipe with their first characters. These tags are internal to the pipe and do not affect compression.

Lossy Compression: The invention has been described in the context of a lossless compression implementation. The data compression system disclosed herein can also be implemented so as to provide high levels of lossy compression, utilizing the known technique of vector quantization. In particular, the systolic pipe mechanism can be used to store a codebook table having one entry per processor. In this embodiment of the invention, the index and bit-displacement of the closest match found thus far are carried along with vectors as they pass through the encoding pipe.

Those skilled in the art will appreciate that the invention offers a combination of high speed and flexibility not previously available. It can process data at the rate of 320 million bits per second in a single pass, employing novel learning algorithms to continuously adapt to changing characteristics of the data. The invention utilizes novel textual substitution methods, including matching and dictionary update techniques, that yield compression superior to that attained by conventional methods, while being adapted to simple, high-speed, parallel implementations.

It will thus be seen that the invention efficiently attains the objects set forth above, among those made apparent from the preceding description. It will be understood that changes may be made in the above construction and in the foregoing sequences of operation without departing from the scope of the invention. For example, the processors can be configured to execute approximate matching of data strings. Other match heuristics can be implemented, including serial-type match heuristics.

It is accordingly intended that all matter contained in the above description or shown in the accompanying drawings be interpreted as illustrative rather than in a limiting sense.

It is also to be understood that the following claims are intended to cover all of the generic and specific features of the invention as described herein, and all statements of the scope of the invention which, as a matter of language, might be said to fall therebetween.

Having described the invention, what is claimed as new and secured by Letters Patent is:

1. A real-time digital processing apparatus for dynamically compressing an input data stream of characters into a compressed stream of digital codes, and for dynamically decompressing a compressed stream of digital codes into an uncompressed stream of characters, the apparatus comprising:
   a plurality of digital data storage and processing cells connected in a systolic pipe array, each digital data storage and processing cell including digital data storage means for storing digital data,
   the digital data storage means in each digital data storage and processing cell being in communication with a digital data storage element in a preceding or a succeeding digital data storage and processing cell in the systolic pipe of digital data storage and processing cells,
   the systolic pipe including:
   input means for receiving the input data stream of characters at an input end of the systolic pipe array, dictionary means for storing an indexed dictionary of strings of characters received in the input data stream, each stored string in the dictionary of strings being stored in association with a corresponding digital pointer value representative of the corresponding stored string, comparator means for comparing successive portions of the input stream with the strings stored in the digital data storage elements, to detect a portion of the input stream that matches a corresponding one of the stored strings, the comparator means including match means for detecting the longest possible portion of the input stream that will match a corresponding one of the stored strings, the match means including means for constructing successively longer matched portions of the input stream for pairs of smaller, previously matched portions of the input stream, means for transmitting, in place of the detected portion of the input stream that matches a corresponding stored string, the pointer representative of the corresponding stored string, thereby to convert the input stream in a compressed set of pointers representative of the input stream, decompression means for receiving a stream of pointers representative of strings of characters, the decompression means comprising means for comparing each received pointer with strings stored in the dictionary to locate a string corresponding to each received pointer, and means for transmitting, in place of each received pointer corresponding to a stored string, the stored string corresponding to the pointer, thereby to decompress the stream of pointers into an uncompressed stream of characters, means for ensuring that the encoder and decoder have a consistent method for leaning pairs of pointers by employing a modified learning rule and/or retiming of the input-output stream.

2. Apparatus according to claim 1, wherein the digital data storage means comprises first and second register means for storing portions of the input stream.

3. Apparatus according to claim 1, wherein the decompression means comprises means for generating a STOP bit upon detection of a match between a received pointer and a string stored in the dictionary means, and means for transmitting the STOP bit to the preceding digital storage and processing cell in the systolic pipeline array, thereby to control the volume of data generated by the decompression means.

4. Apparatus according to claim 3, wherein the decompression means comprises means, responsive to detection of the STOP bit at the input end of the systolic pipeline array, for generating an XON/XOFF signal representative of a request to temporarily suspend transmission of pointers by an external data source, and means for transmitting to the external data source the XON/XOFF signal.

5. Apparatus according to claim 1, further comprising FLUSH means for generating a FLUSH signal representative of a request to expel data stored in the systolic pipeline array through successive cells of the systolic pipeline array, thereby to enable any of reception of a new data stream, generation of a new dictionary, or switch from compression to decompression.

6. Apparatus according to claim 5, further comprising compression monitoring means, in communication with the FLUSH means, for dynamically monitoring the compression ratio provided by the systolic pipeline array, and for generating the FLUSH signal when the compression ratio falls below a selected threshold, thereby to enable generation of a new dictionary and unique decorability.

7. Apparatus according to claim 6 wherein the FLUSH signal is generated without suspending reception of the input stream.

8. Apparatus according to claim 1, further comprising means for generating a leader bit and for propagating the leader bit through successive cells of the systolic pipeline array, thereby to designate a leader processor that is enabled to execute matching.

9. Apparatus according to claim 8, further comprising update means for updating the dictionary means with matched strings.

10. Apparatus according to claim 9, wherein the update means includes means for generating a mark bit associated with a pointer matched by a designated leader processor.

11. Apparatus according to claim 1, further comprising deletion means for deleting selected strings from the dictionary means when utilization of the dictionary means exceeds a selected threshold.

12. Apparatus according to claim 1, wherein the dictionary means comprises first and second dictionary elements, and the systolic pipe array means comprises SWAP controller means, in communication with the first and second dictionary elements, for detecting utilization levels in the first and second dictionary elements, and for causing a dictionary to be generated in the second dictionary element when the first dictionary element fills to capacity.

13. Apparatus according to claim 1, further comprising means for providing an implicit leader bit.

14. Apparatus according to claim 1, further comprising means for flexible processor ordering and usage that allows any ordering or processors and any combination of indices to be reserved for other uses.

15. Apparatus according to claim 1, further comprising means for static indexing.

16. Apparatus according to claim 1, further comprising means for providing dummy processors.

17. Apparatus according to claim 1, further comprising means providing for fault-tolerant capability that circumvents cells that are determined to be defective by compression of test data at start-up with increasing numbers of processors.

18. Apparatus according to claim 1, further comprising means for providing pad buffering.

19. Apparatus according to claim 1, further comprising means for providing multiple entries per cell.

20. Apparatus according to claim 1, further comprising means for employing other learning strategies that are determined by two other entries.

21. Apparatus according to claim 1, further comprising means performing for lossy compression by storing vector quantization (VQ) codebook entries.

22. A real time method for dynamically compressing an input data stream of characters into a compressed stream of digital pointers, the method comprising the steps of electrically connecting a plurality of digital data storage and processing cells into a systolic pipe array such that a digital data storage element in each digital data storage and processing cell can communicate with a digital data storage element in a preceding or a succeeding digital data storage and processing cell in the systolic pipe of digital data storage and processing cells, receiving the input data stream of characters at an input end of the systolic pipe array, storing, in the connected digital data storage elements of the digital data storage and processing cells of the systolic pipeline array, an indexed dictionary or strings of characters received in the input data stream, each stored string in the dictionary of strings being stored in association with a corresponding digital pointer value representative of the corresponding stored string, comparing, in digital processing elements in the connected digital data storage and processing cells, successive portions of the input stream with the strings stored in the digital data storage elements, to detect a portion of the input stream that matches a corresponding one of the storm strings, and transmitting, in place of the detected portion of the input stream that matches a corresponding stored string, the pointer representative of the corresponding stored string, thereby converting the input stream into a compressed set of pointers representative of the input stream, wherein the comparing step includes the step of detecting a portion that will match a corresponding one of the stored strings, the step of detecting a portion including the step of constructing successively longer matched portions of the input stream from pairs of smaller, previously matched portions of the input stream, said method ensuring that the encoder learns pairs of pointers in a way such that consistent decoding is possible by employing a modified learning rule and or retiming of the input/output stream.

23. A real time method for dynamically decompressing a compressed stream of digital pointers into an uncompressed stream of characters, the method comprising the steps of electrically connecting a plurality of digital data storage and processing cells into a systolic pipe array such that a digital data storage element in each digital data storage and processing cell can communicate with a digital data storage element in a preceding or a succeeding digital data storage and processing cell in the systolic pipe of digital data storage and processing cells, receiving an input stream of pointers representative of strings of characters at an input end of the systolic pipe array, storing, in the connected digital data storage elements of the digital data storage and processing cells of the systolic pipeline array, an indexed dictionary or strings of characters received in the input data stream, each stored string in the dictionary of strings being stored in association with a corresponding digital pointer value representative of the corresponding stored string, comparing each received pointer with the strings stored in the dictionary to locate a string corresponding to each received pointer, and transmitting, in place of each pointer corresponding to a stored string, the stored string corresponding to the received pointer, thereby to decompress the stream of pointers into an uncompressed stream of characters said method ensuring that the decoder learns pairs of pointers in a way that is consistent with an encoding by employing a modified learning rule and or retiming of the input/output stream.

* * * * *